United States Patent [19]
Allen et al.

[11] Patent Number: 5,801,571
[45] Date of Patent: Sep. 1, 1998

[54] CURRENT MODE ANALOG SIGNAL MULTIPLEXOR

[75] Inventors: Max J. Allen, Cupertino; Richard E. Colbeth, Los Altos, both of Calif.; Martin Mallinson, British Columbia, Canada

[73] Assignee: Varian Associates, Inc., Palo Alto, Calif.

[21] Appl. No.: 758,528

[22] Filed: Nov. 29, 1996

[51] Int. Cl.$^6$ .................. H03K 17/56; H03F 3/68
[52] U.S. Cl. .................. 327/407; 327/99; 330/254
[58] Field of Search .................. 327/411, 408, 327/407, 99, 379, 384; 330/254

[56] References Cited

U.S. PATENT DOCUMENTS

| | | | |
|---|---|---|---|
| 4,191,856 | 3/1980 | Nagano et al. | 327/411 |
| 4,572,967 | 2/1986 | Metz | 327/411 |
| 5,130,567 | 7/1992 | Rutten et al. | 327/103 |
| 5,148,121 | 9/1992 | Uchida | 327/411 |
| 5,304,853 | 4/1994 | Choi | 327/411 |
| 5,352,987 | 10/1994 | Harvey | 327/411 |
| 5,355,035 | 10/1994 | Vora et al. | 327/433 |
| 5,430,400 | 7/1995 | Herlein et al. | 327/407 |

OTHER PUBLICATIONS

Analog Devices, Inc., "1994 Design–In Reference Manual", 1994, pp. 2–9.
Paul Horowitz and Winfield Hill, "The Art of Electronics Second Edition", 1991—Cambridge University Press, pp. 614–618.

Primary Examiner—Timothy P. Callahan
Assistant Examiner—Terry L. Englund
Attorney, Agent, or Firm—Hunter L. Auyang

[57] ABSTRACT

A current mode analog signal multiplexor includes multiple input multiplexed differential amplifiers, and an output differential current amplifier. An input multiplex control signal selects and enables one of the input multiplexed differential amplifiers for buffering and steering the input signal current to one side of the output differential current amplifier. The reference amplifier drives the other side of the output differential current amplifier. The output node of the output differential current amplifier remains at a substantially constant voltage potential while providing an output current which varies in relation to the selected input signal.

21 Claims, 1 Drawing Sheet

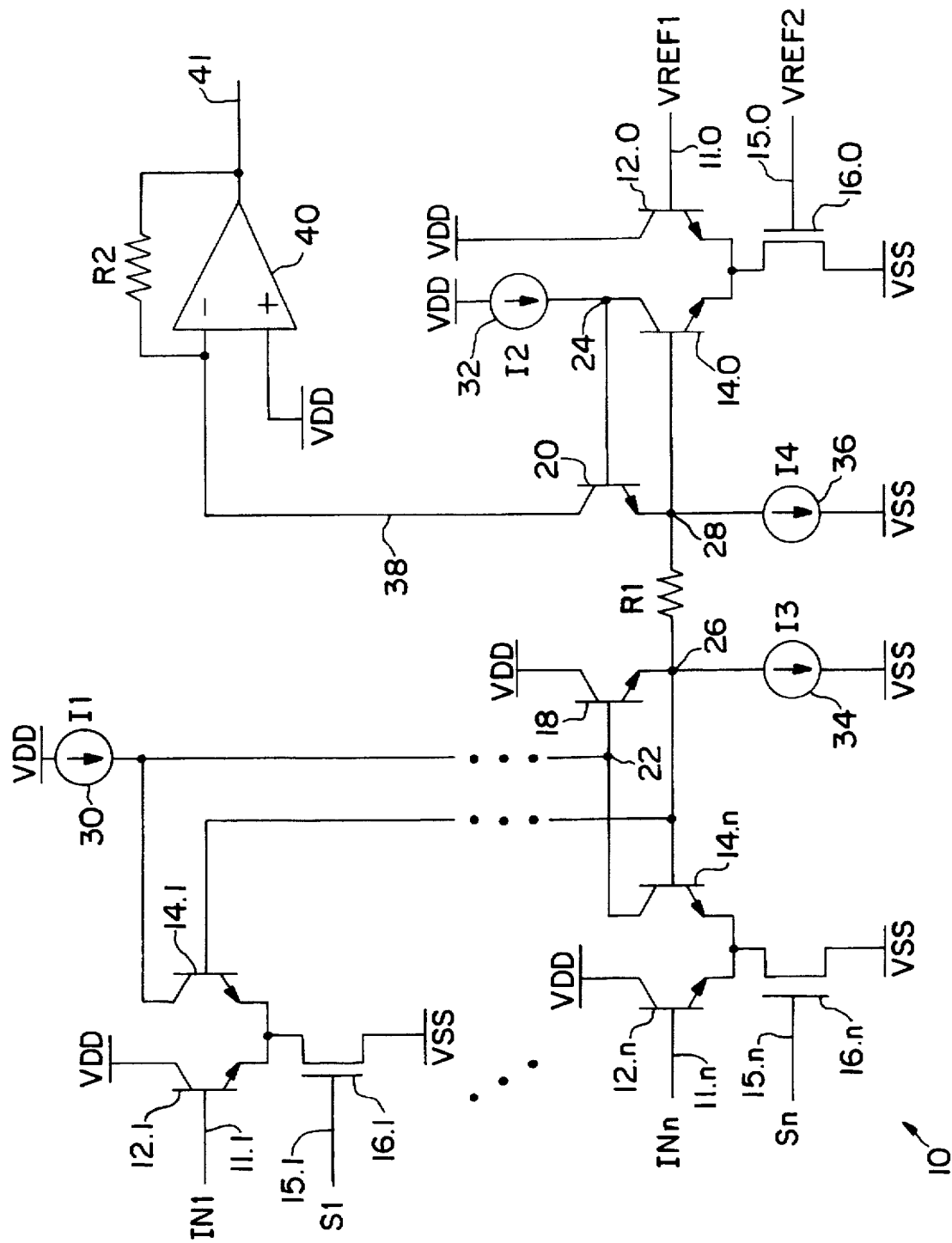

CURRENT MODE ANALOG SIGNAL MULTIPLEXOR

FIELD OF THE INVENTION

The present invention relates to signal multiplexors, and in particular, to signal multiplexors operating in a current mode whereby the selected input signal current is buffered and directed, or steered, to the output.

BACKGROUND OF THE INVENTION

In conventional analog signal multiplexors, some number of analog signal switches are connected to a voltage buffer which buffers the selected input signal and acts as the signal driver for the resulting buffered signal for the stage which follows the multiplexor. Such multiplexors typically operate in a purely voltage mode, i.e., the input signals, the internal signals and the output signal are all processed according to their voltage levels.

While such multiplexors can be operated at high multiplexing rates, such voltage mode operation has a number of disadvantages when the multiplexor is integrated into a single chip. For example, when implemented in integrated form, the output buffer of the multiplexor must often drive the voltage signal off of the chip, e.g., to an off-chip analog-to-digital converter. Due to the typically low power nature of the output voltage buffer, however, the capacitive load presented to the output pin via which the output signal is driven (e.g., due to the packaging and interconnection characteristics of the integrated circuit and the load circuit connected to such pin, driving the voltage off of the chip into such a substantial capacitive load requires a significant output current. In turn, in order to be able to drive such a significant amount of output current, the circuit implementation must be quite large in area, thereby causing the chip area to be larger than otherwise desired.

Further, the relatively large output voltage swings required of the output voltage buffer and the voltage drivers within the multiplexor result in large variation in the on-chip power supply current. In turn, this causes power supply "bounce" due to the inductance of the interconnections to the chip and the large variations in the current being supplied through such interconnections.

Accordingly, it would be desirable to have an analog signal multiplexor which does not require a large output driving current and which, therefore, minimizes the amount of power supply noise introduced and circuit area required to implement such multiplexor.

SUMMARY OF THE INVENTION

A current mode analog signal multiplexor in accordance with the present invention operates in a purely current mode, whereby input signal currents are selectively buffered and directed, or steered, to an output node which is maintained at a constant voltage potential. Power supply noise introduced by such a multiplexor is minimized by drawing a substantially constant power supply current and maintaining the voltage level of the output at a substantially constant potential.

A current mode analog signal multiplexor for steering an output current signal having a magnitude which varies in relation to a selected input signal magnitude in accordance with one embodiment of the present invention includes a plurality of input signal amplifiers, a reference amplifier and an output current amplifier. The plurality of input signal amplifiers is configured to receive a plurality of multiplex control signals and a plurality of input signals and in accordance with a selected one of the input signals which corresponds to one of the multiplex control signals receive and conduct a first portion of a first source current and a first portion of a first output current. The first portion of the first source current and the first portion of the first output current each have a magnitude which varies in a respective relation to a magnitude of the selected one of the input signals. The reference amplifier is configured to receive a reference voltage and a control voltage and in accordance therewith receive and conduct a first portion of a second source current and a first portion of a second output current. The first portion of the second source current and the first portion of the second output current each have a magnitude which varies in a respective relation to a magnitude of the reference voltage. The output current amplifier is coupled between the input signal amplifiers and the reference amplifier and is configured to receive and conduct a second portion of the first source current, provide the first output current including the first portion thereof and a second portion thereof, receive and conduct a second portion of the second source current, provide the second output current including the first portion thereof and a second portion thereof, and conduct a third output current. The second portions of the first and second source currents, the second portions of the first and second output currents and the third output current each have a magnitude which varies in a respective relation to the magnitude of the selected one of the plurality of input signals.

A current mode analog signal multiplexor for steering an output current signal having a magnitude which varies in relation to a selected input signal magnitude in accordance with another embodiment of the present invention includes an input-multiplexed, differential amplifier, an output differential current amplifier and a resistive circuit. The input-multiplexed, differential amplifier includes a plurality of multiplex control terminals configured to receive a plurality of multiplex control signals, a plurality of noninverting input terminals configured to receive a plurality of input signals corresponding to the multiplex control signals, a plurality of inverting input terminals configured to receive a first portion of a first output current, and an output terminal connected to each one of the inverting input terminals and configured to provide the first output current including the first portion thereof and a second portion thereof. The first portion of the first output current has a magnitude which varies in relation to a magnitude of a selected one of the input signals corresponding to one of the multiplex control signals. The output differential current amplifier includes a control terminal configured to receive a control voltage, a noninverting input terminal configured to receive a reference voltage, an inverting input terminal configured to receive a first portion of a second output current, a first output terminal connected to the inverting input terminal and configured to provide the second output current including the first portion thereof and a second portion thereof, and a second output terminal configured to conduct a third output current. The first portion of the second output current has a magnitude which varies in relation to a magnitude of the reference voltage, and the second portions of the first and second output currents and the third output current each have a magnitude which varies in a respective relation to the magnitude of the selected one of the input signals. The resistive circuit is coupled between the input-multiplexed, differential amplifier and the output differential current amplifier and is configured to conduct the second portions of the first and second output currents.

These and other features and advantages of the present invention will be understood upon consideration of the following detailed description of the invention and the accompanying drawings.

BRIEF DESCRIPTION OF THE DRAWING

The FIGURE illustrates a schematic diagram of a current mode analog signal multiplexor in accordance with one embodiment of the present invention.

DETAILED DESCRIPTION OF THE INVENTION

A current mode analog signal multiplexor 10 in accordance with one embodiment of the present invention includes multiple multiplexed differential current amplifiers for receiving and multiplexing the input signal 11.1–11.n in accordance with corresponding multiplex control signals 15.1–15.n. Each of the input amplifiers includes two NPN bipolar junction transistors 12.i, 14.i connected in an opposing, or differential, configuration, and an N-type metal oxide semiconductor field effect transistor (N-MOSFET) 16.i, with their respective emitter and drain terminals interconnected as shown. The MOSFET 16.i receives a multiplex control signal 15.i which either enables or disables the input amplifier. When the input amplifier is enabled, the corresponding input signal 11.i is received and amplified by the NPN transistors 12.i, 14.i (discussed in more detail below).

Another amplifier similar to each of the input amplifiers is used as a reference amplifier, and also includes a pair of NPN transistors 12.0, 14.0 connected in an opposing configuration, and an N-MOSFET 16.0, with their respective emitter and drain terminals interconnected as shown. The base of the first NPN transistor 12.0 is biased by a first reference voltage 11.0, while the gate of the N-MOSFET 16.0 is biased by a second reference voltage 15.0.

An output amplifier, which includes two NPN transistors 18, 20 connected in an opposing configuration with a resistor R1 interposed between their emitter terminals, is connected between the set of input amplifiers and the reference amplifier, as shown. The base and emitter terminals of the first NPN transistor 18 are connected to all of the collector and base terminals, respectively, of the second NPN transistors 14.i in the input amplifiers. Similarly, the base and emitter terminals of the second NPN transistor 20 are connected to the collector and base terminal, respectively, of the second NPN transistor 14.0 of the reference amplifier, as shown.

Node 22 is driven by a current source 30 which provides a DC current having a magnitude I1. Similarly, node 24 is driven by a current source 32 which provides a DC current having a magnitude I2. Nodes 26 and 28 are connected to current sources 34, 36 which sink DC currents having magnitudes I3 and I4. (Ideally, DC currents I3 and I4 would be equal in magnitude; however, one current may be higher than the other as necessary (e.g., due to the need to drive an off-chip node 26/28), with appropriate scaling, as needed, of the corresponding elements driving or being driven by nodes 26 and 28.)

The output node 38 of the output amplifier is connected to the inverting input of an operational amplifier 40 whose noninverting input is connected to the positive power supply potential VDD. The operational amplifier 40 is configured as an inverting amplifier with a feedback resistor R2 connected between it output and inverting input terminals. Hence, the voltage potential of the output node 38 of the output amplifier is maintained at a potential which is substantially equal to that of the positive power supply potential VDD.

Operation of this current mode analog signal multiplexor 10 can be explained as follows. When one of the input signals 11.i is to be selected for multiplexing to the output, its corresponding multiplex control signal 15.i is set at a logic high, thereby turning on the corresponding MOSFET 16.i. This enables the corresponding NPN transistors 12.i, 14.i to amplify the selected incoming input signal 11.i.

In accordance with well known differential amplifier characteristics, as the selected input signal current increases and decreases, the emitter current of the input transistor 12.i increases and decreases, respectively. Accordingly, the emitter, base and collector currents of the output transistor 14.i all decrease and increase, respectively. The remaining multiplex control signals are set at a logic low, thereby turning off the remaining MOSFETs and disabling the remaining NPN transistor pairs of the remaining input amplifiers.

As the collector current of the output transistor 14.i of the enabled input amplifier decreases and increases, more and less, respectively, of current I1 from current source 30 is available to drive the base of the input transistor 18 of the output amplifier. Similarly, as the base current of the output transistor 14.i of the enabled input amplifier decreases and increases, more and less, respectively, emitter current from the input transistor 18 of the output amplifier is available for conduction through resistor R1 (due to the fixed magnitude of current I3 being sunk by current source 34).

Meanwhile, the reference amplifier drives the output transistor 20 of the output amplifier in a similar fashion. The second reference voltage 15.0 is set at a logic high (e.g., tied to the positive power supply potential VDD), thereby turning on N-MOSFET 16.0 and enabling conduction by the NPN transistors 12.0, 14.0. The first reference voltage 11.0 establishes a base current and, therefore, an emitter current for the input transistor 12.0. This, in turn, in accordance with well known differential amplifier characteristics, causes corresponding base, emitter and collector currents to be established for the output transistor 14.0. With the collector current of the output transistor 14.0 (provided by current source 32) thus established, the base current driving the output transistor 20 of the output amplifier (also provided by current source 32) is thereby also established. Accordingly, with the base currents for transistors 14.0 and 20 established, the emitter current for the output transistor 20 of the output amplifier is also established.

Based upon the foregoing, it can be seen, therefore, that current conduction through resistor R1 is established in accordance with variations in the selected input signal 11.i. As the selected input signal 11.i increases and decreases, the current conducted from node 26 to node 28 through resistor R1 increases and decreases, respectively. Accordingly, the collector current of the output transistor 20 of the output amplifier decreases and increases, respectively. This changing collector current is transformed by the operational amplifier 40, which is acting as a transimpedance amplifier, to a changing output voltage 41.

From the foregoing it can be seen that a current mode analog signal multiplexor in accordance with the present invention has a number of advantages. Due to the directing, or steering, of the actual input signal current, power supply noise introduced by the multiplexor is significantly reduced. Additionally, a high rate of signal multiplexing can be achieved with great accuracy due to the fact that the voltage at the output node does not change with signal amplitude since no charging or discharging of an output capacitance is necessary due to the current mode of operation (as opposed to voltage mode).

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a current mode analog signal multiplexor for steering an output current signal having a magnitude which varies in relation to a selected input signal magnitude, said current mode analog signal multiplexor comprising:

a plurality of input signal amplifiers configured to receive a plurality of multiplex control signals and a plurality of input signals, and in accordance with a selected one of said plurality of input signals which corresponds to one of said plurality of multiplex control signals, receive and conduct a first portion of a first source current and a first portion of a first output current, wherein said first portion of said first source current and said first portion of said first output current each have a magnitude which varies in a respective relation to said magnitude of said selected one of said plurality of input signals;

a reference amplifier configured to receive a reference voltage and a control voltage and in accordance therewith receive and conduct a first portion of a second source current and a first portion of a second output current, wherein said first portion of said second source current and said first portion of said second output current each have a magnitude which varies in a respective relation to a magnitude of said reference voltage; and an output current amplifier, coupled between said plurality of input signal amplifiers and said reference amplifier, configured to receive and conduct a second portion of said first source current, provide said first output current including said first portion thereof and a second portion thereof, receive and conduct a second portion of said second source current, provide said second output current including said first portion thereof and a second portion thereof, and conduct a third output current, wherein said second portions of said first and second source currents, said second portions of said first and second output currents and said third output current each have a magnitude which varies in a respective relation to said magnitude of said selected one of said plurality of input signals, wherein said third output current is said output current signal.

2. The apparatus of claim 1, wherein each one of said plurality of input signal amplifiers comprises:

a plurality of bipolar junction transistors, coupled in an opposing configuration, configured to receive said selected one of said plurality of input signals and in accordance with said corresponding one of said plurality of multiplex control signals conduct a first amplified current having a magnitude which varies in relation to said magnitude of said selected one of said plurality of input signals and conduct a second amplified current having a magnitude which varies in relation to a magnitude of said first portion of said first source current and a magnitude of said first portion of said first output current; and a metal oxide semiconductor field effect transistor, coupled to said plurality of bipolar junction transistors, configured to receive said corresponding one of said plurality of multiplex control signals and in accordance therewith conduct said first and second amplified currents.

3. The apparatus of claim 1, wherein said reference amplifier comprises:

a plurality of bipolar junction transistors, coupled in an opposing configuration, configured to receive said reference voltage and in accordance with said control voltage conduct a first amplified current having a magnitude which varies in relation to said magnitude of said reference voltage and conduct a second amplified current having a magnitude which varies in relation to a magnitude of said first portion of said second source current and a magnitude of said first portion of said second output current; and a metal oxide semiconductor field effect transistor, coupled to said plurality of bipolar junction transistors, configured to receive said control voltage and in accordance therewith conduct said first and second amplified currents.

4. The apparatus of claim 1, wherein said output current amplifier comprises:

a differential amplifier with first and second amplifier branches coupled in an opposing configuration, wherein said first amplifier branch is configured to receive and conduct said second portion of said first source current and provide said first output current including said first and second portions thereof, and wherein said second amplifier branch is configured to receive and conduct said second portion of said second source current, provide said second output current including said first and second portions thereof, and conduct said third output current; and a resistive circuit, coupled between said first and second amplifier branches, configured to conduct said second portions of said first and second output currents.

5. The apparatus of claim 4, wherein said first and second output currents each further includes a third portion thereof, and wherein said output current amplifier further comprises first and second current sources coupled to said first and second amplifier branches and configured to provide said third portions of said first and second output currents, respectively.

6. The apparatus of claim 1, further comprising a transimpedance amplifier, coupled to said output current amplifier, configured to conduct said third output current and in accordance therewith provide an output voltage having a magnitude which varies in relation to said magnitude of said selected one of said plurality of input signals.

7. The apparatus of claim 1, further comprising first and second current sources, coupled to said plurality of input signal amplifiers and, said reference amplifier, respectively and to said output current amplifier, configured to provide said first and second source currents, respectively.

8. An apparatus including a current mode analog signal multiplexor for steering an output current signal having a magnitude which varies in relation to a selected input signal magnitude, said current mode analog signal multiplexor comprising:

an input-multiplexed, differential amplifier including a plurality of multiplex control terminals configured to receive a plurality of multiplex control signals, a plurality of noninverting input terminals configured to receive a plurality of input signals corresponding to said plurality of multiplex control signals, a plurality of inverting input terminals configured to receive a first portion of a first output current, and an output terminal connected to each one of said plurality of inverting input terminals and configured to provide said first output current including said first portion thereof and a second portion thereof, wherein said first portion of said first output current has a magnitude which varies in relation to said magnitude of a selected one of said plurality of input signals corresponding to one of said plurality of multiplex control signals;

an output differential current amplifier including a control terminal configured to receive a control voltage, a noninverting input terminal configured to receive a reference voltage, an inverting input terminal configured to receive a first portion of a second output current, a first output terminal connected to said inverting input terminal and configured to provide said second output current including said first portion thereof and a second portion thereof, and a second output terminal configured to conduct a third output current, wherein said first portion of said second output current has a magnitude which varies in relation to a magnitude of said reference voltage, and wherein said second portions of said first and second output currents and said third output current each have a magnitude which varies in a respective relation to said magnitude of said selected one of said plurality of input signals, wherein said third output current is said output current signal; and a resistive circuit, coupled between said input-multiplexed, differential amplifier and said output differential current amplifier, configured to receive and conduct said second portions of said first and second output currents.

9. The apparatus of claim 8, wherein said input-multiplexed, differential amplifier comprises:

a plurality of input signal amplifiers with said plurality of multiplex control terminals, said plurality of noninverting input terminals, said plurality of inverting input terminals and a plurality of input source current terminals configured to receive a first portion of a source current having a magnitude which varies in a relation to said magnitude of said selected one of said plurality of input signals; and an output signal current amplifier with said output terminal and an output source current terminal configured to receive a second portion of said source current having a magnitude which varies in a relation to said magnitude of said selected one of said plurality of input signals.

10. The apparatus of claim 9, wherein each one of said plurality of input signal amplifiers comprises:

a plurality of bipolar junction transistors, coupled in an opposing configuration, configured to receive said selected one of said plurality of input signals and in accordance with said corresponding one of said plurality of multiplex control signals conduct a first amplified current having a magnitude which varies in relation to said magnitude of said selected one of said plurality of input signals and conduct a second amplified current having a magnitude which varies in relation to a magnitude of said first portion of said source current and a magnitude of said first portion of said first output current; and a metal oxide semiconductor field effect transistor, coupled to said plurality of bipolar junction transistors, configured to receive said corresponding one of said plurality of multiplex control signals and in accordance therewith conduct said first and second amplified currents.

11. The apparatus of claim 8, wherein said output differential current amplifier comprises:

a reference amplifier with said control terminal, said noninverting input terminal, said inverting input terminal and an input source current terminal configured to receive a first portion of a source current having a magnitude which varies in a relation to said magnitude of said reference voltage; and an output signal current amplifier with said first and second output terminals and an output source current terminal configured to receive a second portion of said source current having a magnitude which varies in a relation to said magnitude of said reference voltage.

12. The apparatus of claim 11, wherein said reference amplifier comprises:

a plurality of bipolar junction transistors, coupled in an opposing configuration, configured to receive said reference voltage and in accordance with said control voltage conduct a first amplified current having a magnitude which varies in relation to said magnitude of said reference voltage and conduct a second amplified current having a magnitude which varies in relation to a magnitude of said first portion of said source current and a magnitude of said first portion of said second output current; and a metal oxide semiconductor field effect transistor, coupled to said plurality of bipolar junction transistors, configured to receive said control voltage and in accordance therewith conduct said first and second amplified currents.

13. The apparatus of claim 8, further comprising a transimpedance amplifier, coupled to said output differential current amplifier, configured to conduct said third output current and in accordance therewith provide an output voltage having a magnitude which varies in relation to said magnitude of said selected one of said plurality of input signals.

14. The apparatus of claim 8, wherein said first and second output currents each further includes a third portion thereof, and wherein said current mode analog signal multiplexor further comprises first and second current sources coupled to said output terminal of said input-multiplexed, differential amplifier and said first output terminal of said output differential current amplifier, and configured to provide said third portions of said first and second output currents, respectively.

15. A method of steering an output current signal having a magnitude which varies in relation to a selected input signal magnitude, said method comprising the steps of:

receiving a plurality of multiplex control signals and a plurality of input signals and, in accordance with a selected one of said plurality of input signals which corresponds to one of said plurality of multiplex control signals, receiving and conducting a first portion of a first source current and a first portion of a first output current, wherein said first portion of said first source current and said first portion of said first output current each have a magnitude which varies in a respective relation to said magnitude of said selected one of said plurality of input signals;

receiving a reference voltage and a control voltage and in accordance therewith receiving and conducting a first portion of a second source current and a first portion of a second output current, wherein said first portion of said second source current and said first portion of said second output current each have a magnitude which varies in a respective relation to a magnitude of said reference voltage;

receiving and conducting a second portion of said first source current and in accordance therewith generating said first output current including said first portion thereof and a second portion thereof, wherein said second portion of said first source current and said second portion of said first output current each have a magnitude which varies in a respective relation to said magnitude of said selected one of said plurality of input signals;

receiving and conducting a second portion of said second source current and in accordance therewith generating said second output current including said first portion thereof and a second portion thereof, wherein said second portion of said second source current and said second portion of said second output current each have a magnitude which varies in a respective relation to said magnitude of said selected one of said plurality of input signals; and conducting a third output current in accordance with said first and second output currents, wherein said third output current has a magnitude which varies in a relation to said magnitude of said selected one of said plurality of input signals and said third output current to said output current signal.

16. The method of claim 15, wherein said step of receiving a plurality of multiplex control signals and a plurality of input signals and, in accordance with a selected one of said plurality of input signals which corresponds to one of said plurality of multiplex control signals, receiving and conducting a first portion of a first source current and a first portion of a first output current comprises:

receiving said selected one of said plurality of input signals and in accordance with said corresponding one of said plurality of multiplex control signals conducting a first amplified current having a magnitude which varies in relation to said magnitude of said selected one of said plurality of input signals and conducting a second amplified current having a magnitude which varies in relation to a magnitude of said first portion of said first source current and a magnitude of said first portion of said first output current; and receiving said corresponding one of said plurality of multiplex control signals and in accordance therewith conducting said first and second amplified currents.

17. The method of claim 15, wherein said step of receiving a reference voltage and a control voltage and in accordance therewith receiving and conducting a first portion of a second source current and a first portion of a second output current comprises:

receiving said reference voltage and in accordance with said control voltage conducting a first amplified current having a magnitude which varies in relation to said magnitude of said reference voltage and conducting a second amplified current having a magnitude which varies in relation to a magnitude of said first portion of said second source current and a magnitude of said first portion of said second output current; and receiving said control voltage and in accordance therewith conducting said first and second amplified currents.

18. The method of claim 15, wherein said step of conducting a third output current in accordance with said first and second output currents comprises conducting said third output current in accordance with said first and second output currents such that said third output current magnitude increases as said first output current magnitude decreases.

19. The method of claim 15, further comprising the step of conducting said third output current and in accordance therewith generating an output voltage having a magnitude which varies in relation to said magnitude of said selected one of said plurality of input signals.

20. A method of steering an output current signal having a magnitude which varies in relation to a selected input signal magnitude, said method comprising the steps of:

receiving a plurality of multiplex control signals via a plurality of multiplex control terminals of an input-multiplexed, differential amplifier;

receiving, via a plurality of noninverting input terminals of said input-multiplexed, differential amplifier, a plurality of input signals corresponding to said plurality of multiplex control signals;

receiving a first portion of a first output current via a plurality of inverting input terminals of said input-multiplexed, differential amplifier;

outputting, via an output terminal connected to each one of said plurality of inverting input terminals of said input-multiplexed, differential amplifier, said first output current including said first portion thereof and a second portion thereof, wherein said first portion of said first output current has a magnitude which varies in relation to said magnitude of a selected one of said plurality of input signals corresponding to one of said plurality of multiplex control signals;

receiving a control voltage via a control terminal of an output differential current amplifier;

receiving a reference voltage via a noninverting input terminal of said output differential current amplifier;

receiving a first portion of a second output current via an inverting input terminal of said output differential current amplifier, wherein said first portion of said second output current has a magnitude which varies in relation to a magnitude of said reference voltage;

outputting, via a first output terminal connected to said inverting input terminal of said output differential current amplifier, said second output current including said first portion thereof and a second portion thereof, wherein said second portions of said first and second output currents each have a magnitude which varies in a respective relation to said magnitude of said selected one of said plurality of input signals;

conducting a third output current via a second output terminal of said output differential current amplifier, wherein said third output current has a magnitude which varies in a relation to said magnitude of said selected one of said plurality of input signals wherein said third output current is said output current signal; and conducting said second portions of said first and second output currents via a resistive circuit coupled between said input-multiplexed, differential amplifier and said output differential current amplifier.

21. The method of claim 20, further comprising the step of converting, with a transimpedance amplifier, said third output current to an output voltage having a magnitude which varies in relation to said magnitude of said selected one of said plurality of input signals.

* * * * *